United States Patent
Talledo (10) Patent No.: US 10,204,814 B1
(45) Date of Patent: Feb. 12, 2019

(54) SEMICONDUCTOR PACKAGE WITH INDIVIDUALLY MOLDED LEADFRAME AND DIE COUPLED AT SOLDER BALLS

(71) Applicant: STMicroelectronics, Inc., Calamba (PH)

(72) Inventor: Jefferson Talledo, Calamba (PH)

(73) Assignee: STMicroelectronics, Inc., Calamba (PH)

( * ) Notice: Subject to any disclaimer, the term of this patent is extended or adjusted under 35 U.S.C. 154(b) by 0 days.

(21) Appl. No.: 15/663,624

(22) Filed: Jul. 28, 2017

(51) Int. Cl.
| | |
|---|---|
| *H01L 21/00* | (2006.01) |
| *H01L 21/683* | (2006.01) |
| *H01L 21/56* | (2006.01) |
| *H01L 23/498* | (2006.01) |
| *H01L 23/00* | (2006.01) |
| *H01L 25/065* | (2006.01) |

(52) U.S. Cl.
CPC ........ *H01L 21/6835* (2013.01); *H01L 21/563* (2013.01); *H01L 23/49816* (2013.01); *H01L 24/29* (2013.01); *H01L 25/0657* (2013.01); *H01L 2221/68377* (2013.01); *H01L 2224/056* (2013.01); *H01L 2224/05571* (2013.01); *H01L 2224/05573* (2013.01); *H01L 2224/1134* (2013.01); *H01L 2224/13025* (2013.01); *H01L 2224/13144* (2013.01); *H01L 2224/16145* (2013.01); *H01L 2224/16225* (2013.01); *H01L 2224/29011* (2013.01)

(58) Field of Classification Search
CPC . H01L 21/6835; H01L 25/0657; H01L 24/29; H01L 23/49816; H01L 21/563; H01L 2224/05573; H01L 2224/056; H01L 2224/29011; H01L 2224/05571; H01L 2221/68377; H01L 2224/16145; H01L 2224/13144
USPC ........................................................ 438/106
See application file for complete search history.

(56) References Cited

U.S. PATENT DOCUMENTS

| | | | | |
|---|---|---|---|---|
| 5,844,315 A | * | 12/1998 | Melton | .................. H01L 21/568 257/666 |
| 7,768,125 B2 | * | 8/2010 | Chow | .................. H01L 21/6836 257/686 |
| 8,361,843 B2 | * | 1/2013 | Hung | .................... H01L 21/565 257/706 |

(Continued)

*Primary Examiner* — Vu A Vu
(74) *Attorney, Agent, or Firm* — Seed IP Law Group LLP (57) ABSTRACT

According to principles as taught herein, a leadframe array for a semiconductor die is prepared having locations to receive solder balls. Solder balls are then applied to the leadframe array, after which the leadframe array and solder ball combination is placed in a first mold and encased in a first molding compound. After the molding compound is cured, a layer of molding compound is removed to expose the solder balls. After this, a semiconductor die is electrically connected to the exposed solder balls. The combined semiconductor die and leadframe are placed in a second mold, and a second molding compound injected. The second molding compound flows around the semiconductor die and leadframe combination, fully enclosing the electrical connections between the leadframe and the semiconductor die, making the final package a twice-molded configuration. After this, the twice-molded semiconductor package array is cut at the appropriate locations to singulate the packages into individual products.

21 Claims, 6 Drawing Sheets

(56) References Cited

U.S. PATENT DOCUMENTS

| | | | |
|---|---|---|---|
| 8,492,883 B2* | 7/2013 | Chien | H01L 21/4832 |
| | | | 257/676 |
| 8,906,797 B2* | 12/2014 | Jiang | H01L 21/563 |
| | | | 438/123 |
| 2013/0043573 A1* | 2/2013 | Williams | H01L 23/4334 |
| | | | 257/676 |

* cited by examiner

SEMICONDUCTOR PACKAGE WITH INDIVIDUALLY MOLDED LEADFRAME AND DIE COUPLED AT SOLDER BALLS

BACKGROUND

Technical Field

This disclosure is in the field of semiconductor packages, and in particular, is directed towards a semiconductor package in which the leadframe and semiconductor package are each molded separately, then are joined together with solder balls.

Description of the Related Art

Semiconductor packages must protect the semiconductor die from the external environment while providing an output at the electrical signals for use by other circuits. The package, therefore, must be sufficiently protective and robust to prevent damage to the semiconductor die, while at the same time providing electrical connections so the signals may be received by and sent out from the semiconductor die.

Traditionally, a semiconductor die is placed on a leadframe or other substrate, and it is then electrically connected to this leadframe by bonding wires, solder balls, or other electrical coupling. After this, the combination is placed in a mold, and a molding compound injected into the mold to fully encase the die, but leave some of the electrical connections exposed so that it may be connected to the outside environment. Such an approach, while beneficial in many circumstances, has the goal of securely enclosing the semiconductor die while at the same time ensuring there is exposure to the electrical connections that extend away from the semiconductor die. Improvements in the packaging process, and the end package itself, will provide the benefit of greater reliability in the operation over the longer term use of the die, as well as having fewer failures during the semiconductor packaging process.

BRIEF SUMMARY

According to principles as taught herein, a leadframe array for a semiconductor die is prepared having locations to receive solder balls. Solder balls are then applied to the leadframe array, after which the leadframe array and solder ball combination is placed in a first mold and encased in a first molding compound. In one embodiment, the solder balls are fully encased in molding compound so as to be completely surrounded by the molding compound.

After the molding compound is cured, a layer of molding compound is removed to expose the solder balls. After this, a semiconductor die is electrically connected to the exposed solder balls. The combined semiconductor die and leadframe are placed in a second mold, and a second molding compound injected. The second molding compound flows around the semiconductor die and leadframe combination, fully enclosing the electrical connections between the leadframe and the semiconductor die, making the final package a twice-molded configuration. After this, the twice-molded semiconductor package array is cut at the appropriate locations to singulate the packages into individual products.

The present method permits the leadframe array to be fully constructed, encapsulated, and provided with electrical connections in a separate manufacturing line, prior to the introduction of the semiconductor die. Only after the leadframe array is encapsulated is the semiconductor die connected to the leadframe, thus providing a more rapid, and lower cost, technique for attaching the die to the leadframe. The leadframe is an array of leadframes, having many hundreds, or many thousands, of positions for a die. Accordingly, the package can be mass-produced with thousands of semiconductor die attached to the array of leadframes, after which the combination is placed in a second mold, encapsulated in a second molding compound and then singulated.

DETAILED DESCRIPTION

Figure 1:
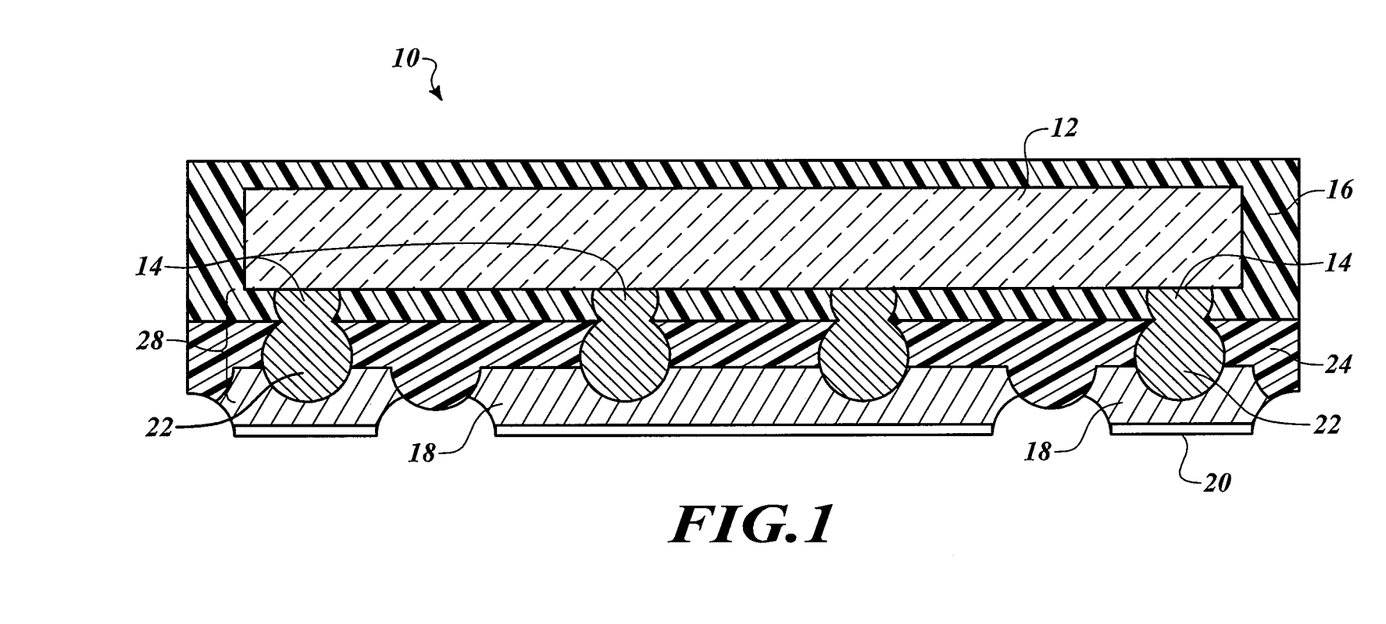
FIG. 1 is a cross-sectional view of a completed semiconductor package according to principles disclosed herein.

FIG. 1 is a cross-sectional view of a twice-molded semiconductor chip package 10 according to principles as taught herein. The package 10 includes a semiconductor die 12 which is encased in a molding compound 16. Solder bumps 14 extend from pads on the semiconductor die 12 to provide electrical connections to the circuits thereon. A leadframe 18 is separately encased in its own molding compound 24. The leadframe 18 has solder balls 22, which are electrically connected to the solder bumps 14 extending from the semiconductor die 12. A conductive layer 20 extends along an exposed surface of leadframe 18. The layer 20 is composed of one or more layers of material which are electrically conductive and provide, in most embodiments, a solderable metal in order to solder the twice-molded package 10 to a printed circuit board or other substrate for use in a larger circuit.

As can be seen in FIG. 1, the solder bump 14 extending from the semiconductor die 12 and the solder ball 22 extending from the leadframe 18 are joined as an integral, single solder ball 28, which provides a contiguous single metal connection between the semiconductor die 22 and the leadframe 18. The single electrical connection 28 is achieved by reflowing the solder bumps 14 and 22 together at a temperature that approaches their melting point, in order to join them as a single, continuous solder ball connection.

In the embodiment of FIG. 1, the molding compound 16 completely encases and fully surrounds semiconductor die 12. This isolates semiconductor die 12 from the outside environment, blocking electrical access, moisture ingress, and providing mechanical coupling to the leadframe molding compound 24.

Figure 2:
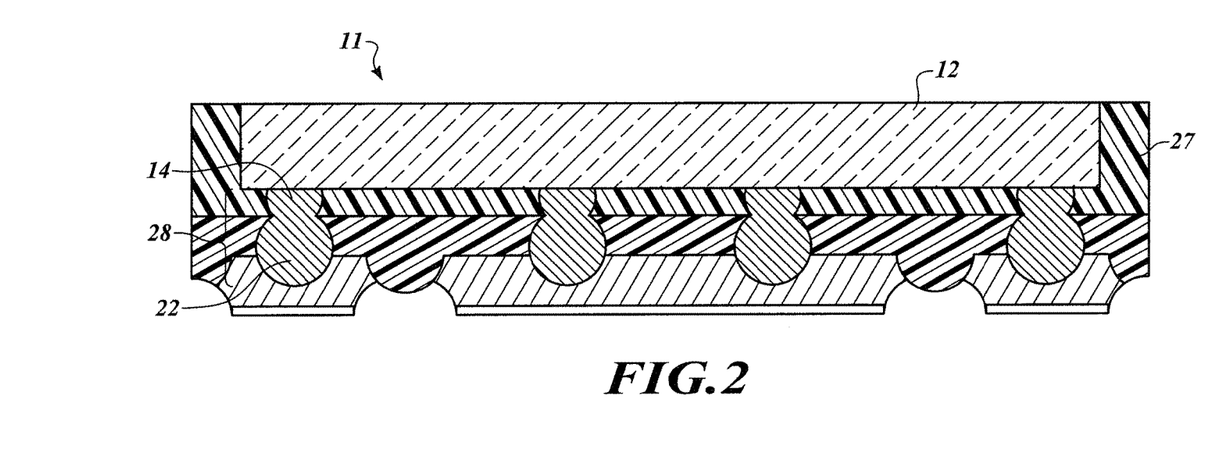
FIG. 2 is a cross-sectional view of an alternative embodiment of a semiconductor package according to principles disclosed herein.

FIG. 2 shows a low-profile package 11, which is an alternative embodiment of the twice-molded semiconductor package 10 of FIG. 1. FIG. 2 illustrates a semiconductor die 12 coupled to a leadframe 18 in a similar manner to the package shown in FIG. 1. In the embodiment of FIG. 2, the molding compound 16 extends along the sides of the semiconductor die 12 but does not fully surround or encase the semiconductor die 12. Rather, the molding compound 16 extends completely between the semiconductor die 12 and the leadframe 18 and along the sidewalls of the semiconductor die, but does not cover the back side of the die 12.

The package 11, as shown in FIG. 2, has the benefit that it can be made substantially thinner than the package of FIG. 1. It is useful in those embodiments where a low-profile package is desired.

The low-profile package 11, as shown in FIG. 2, can be manufactured by a number of different techniques. It can be made using the process as shown in FIGS. 4-8 as explained herein, with the modification that, when the joint die and leadframe combination is placed in the mold, the shape of the mold ensures that the molding compound 16 only extends along the sidewalls of the die 12, and is blocked from going across the back of the die 12. An alternative method for producing the low-profile package 11 of FIG. 2 is to follow the same method steps used as making the package of FIG. 1 and, after the package is fully completed, milling off the top section of the semiconductor die 12, and along with the molding compound 27. Namely, when the manufacturing process is in the stage as shown in FIG. 8, the subsequent step is to remove the top section of the package. This can be done by sawing, milling, grinding, polishing, use of CMP, or other acceptable technique to perform a blanket removal of the top portion of the molding compound 27, and then, after all the top layer of molding compound 16 is removed, and then upon exposure of the semiconductor die 12, terminate removal of the molding compound 27. Thus, the exposure of the semiconductor die 12 can act as a stopping layer on which the removal of the molding compound 16 takes place.

Alternatively, if an ultrathin, extremely low-profile package 11 is desired, then the removal of the package can continue significantly past when the semiconductor die 12 is exposed, to remove substantial portions of the semiconductor die 12, together with the molding compound 27. Namely, the blanket removal of the top side of the package can continue to remove a significant height of the semiconductor die 12 along with the molding compound 27 to substantially reduce the profile of the overall package. In this embodiment, an ultrathin package can be obtained, in which the semiconductor die 12 has approximately half or even one-third of its standard height, and the molding compound 27 is flush with the top of the semiconductor die 12 in the final ultrathin package 11, as shown in FIG. 2.

Figure 3:
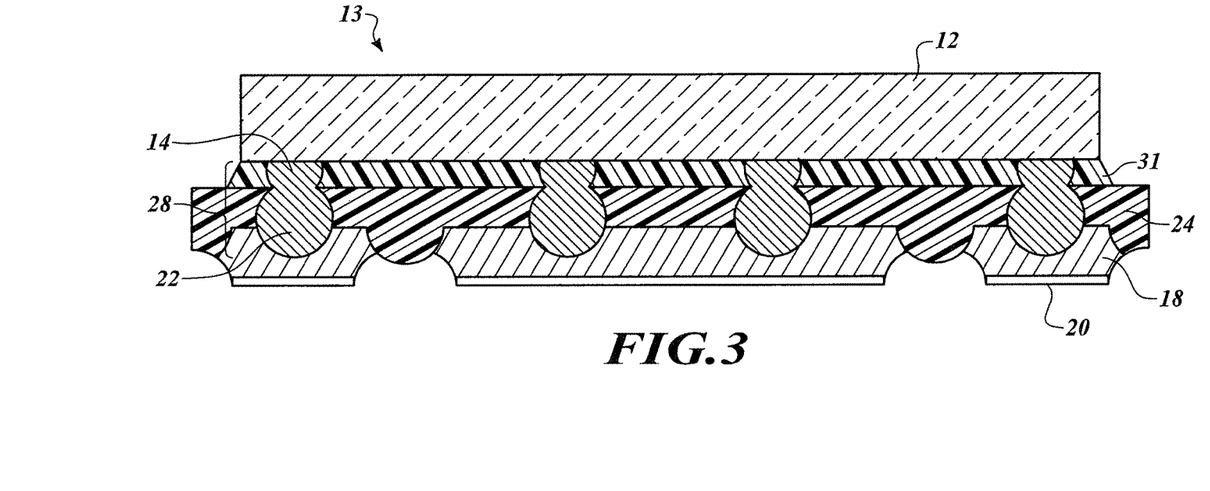
FIG. 3 is a cross-sectional view of yet another alternative embodiment according to principles disclosed herein.

FIG. 3 illustrates a further alternative embodiment of a minimally molded package 13 having the semiconductor die 12 coupled to the leadframe 18. In the minimally twice-molded package 13, as shown in FIG. 3, the semiconductor die 12 is coupled to the leadframe 18 and the molding compound 24 by a thin underfill 31 which extends only between the die 12 and the molding compound 24. In the embodiment of the package of FIG. 3, the underfill 31 does not extend along the sidewalls or the back of the die 12, rather it extends only between the die 12 and the molding compound 24 in order to fully enclose and protect the solder bumps 14. The leadframe portion of FIG. 3 is similar to that as explained in FIG. 1, namely having a leadframe 18 of a first metal, such as copper, a coating layer 20 of a second metal, such as nickel, or a combination of nickel, palladium, and gold, and solder balls 22. A molding compound 24 encases the solder balls 22 and the leadframe 18. The solder bumps 14 extending from the semiconductor 12 has been reflowed with the solder ball 22 to create a single integral solder ball 28 that extends from the semiconductor die 12 to the leadframe 18.

The embodiment of FIGS. 2 and 3 are beneficial in some particular environments in which it is desired to have some portion of the semiconductor die 12 exposed. In some packages, such as gas composition sensors, temperature sensors, optical readers, fingerprint readers, capacitive sensors, and other designs, it is desirable to have some portion of the circuits on semiconductor die 12 exposed to an outside environment. The embodiments of FIGS. 2 and 3 provide a twice-molded encapsulation package which also permits the semiconductor die 12 to have one or more surfaces exposed to an ambient atmosphere in those embodiments in which it desired because of the design or function of die 12. They also provide embodiments of an ultrathin package having a low profile which is desired in some end products, such as a wrist watch, wearable clothing, attachment to eyewear, a credit card, or other ultrathin environment in which a low profile packaged semiconductor chip is desired.

FIGS. 4-8 illustrate one method of making the twice-molded semiconductor package 10 as shown in FIG. 1, as well as the alternative embodiments of the packages 11 and 13 as shown in FIGS. 2 and 3.

Figure 4:
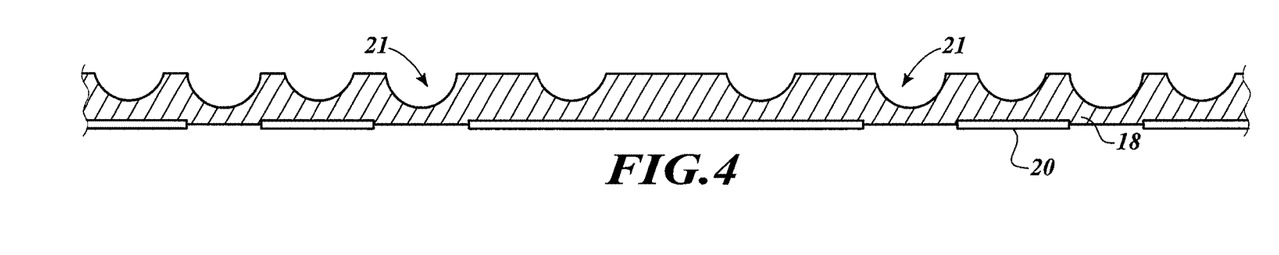
FIGS. 4-8 are cross-sectional views of the process steps for making a semiconductor package according to principles as taught herein.

FIG. 4 shows a leadframe array 18 made of a first metal having a second metal coating 20 at selected locations on an exposed surface thereof. The leadframe 18 can be made of any acceptable first metal such as copper, aluminum, or the like. In a preferred embodiment, the leadframe 18 is made of copper and is a single continuous mesh that includes many hundreds or thousands of leadframes for individual semiconductor packages. The second metal layer 20 will act as an etch mask for a later etch step of the leadframe 18 and, thus, is made of a second type of metal which permits selective etching of the leadframe 18 with respect to the metal 20. The metal 20 can be made of any acceptable metal, such as nickel, a trilayer coating of nickel, palladium, and gold, or other conductive layer of a type well known in the art that is preferably easily wettable by solder.

Layer 20 is applied as a blanket layer to the exposed surface of the leadframe 18 and patterned and etched to a desired pattern as shown in FIG. 4 using techniques well known in the art. In addition, the leadframe 18 has recesses 21 formed therein at locations where it is desired to provide electrical connections to a semiconductor die. The recesses 21 can be formed using a mask and etching process. Preferably, a wet etch is carried out with a proper mask in place in order to form the recesses 21. The recesses may be formed by other techniques known in the art. In the embodiment shown in FIG. 4, the recesses 21 are semicircular because they are formed by a wet etch carried out on the leadframe 18. If desired, the recesses 21 can be rectangular, slots, grooves, or any acceptable shape. In one embodiment, they can be formed by sawing thin grooves or recesses in the leadframe 18 using a mechanical saw or other techniques known in the art for creating recesses in leadframes.

Figure 5:
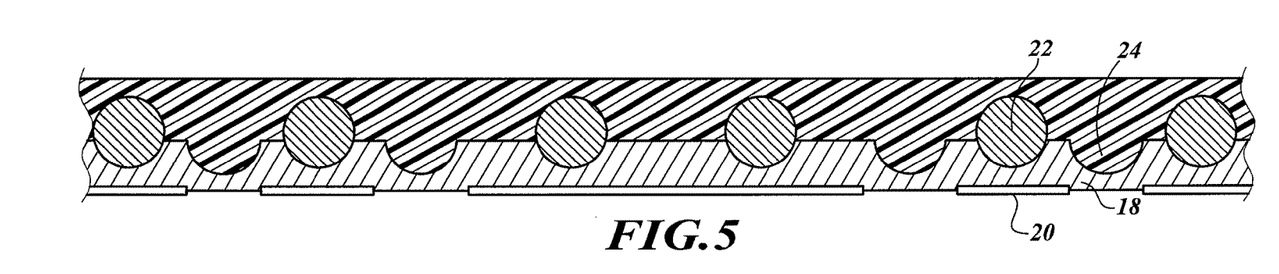

FIG. 5 shows the leadframe 18 after conductive solder balls 22 have been affixed thereto and then the entire leadframe array has been placed into a mold and molding compound 24 injected therein. This is carried out by, after the leadframe array is fully prepared, as shown in FIG. 4, conductive metal, preferably solder balls 22 or other acceptable conductive metal, being placed at the prepared locations 21 in the leadframe 18. This completes the electrical connections for the leadframe 18. The combined leadframe 18 and solder balls 22 are placed first in a mold and a first molding compound 24 inserted to encapsulate and fully enclose the upper surface of the leadframe 18 as well as the entire solder balls 22. Sufficient molding compound is injected to ensure that the solder balls 22 are fully encased.

This serves to immobilize the solder balls 22 while isolating them from the outside environment. The leadframe 18 is removed from the first mold and the first molding compound cured to achieve a fully hardened molding compound 24 to obtain the structure of FIG. 5.

Figure 6:
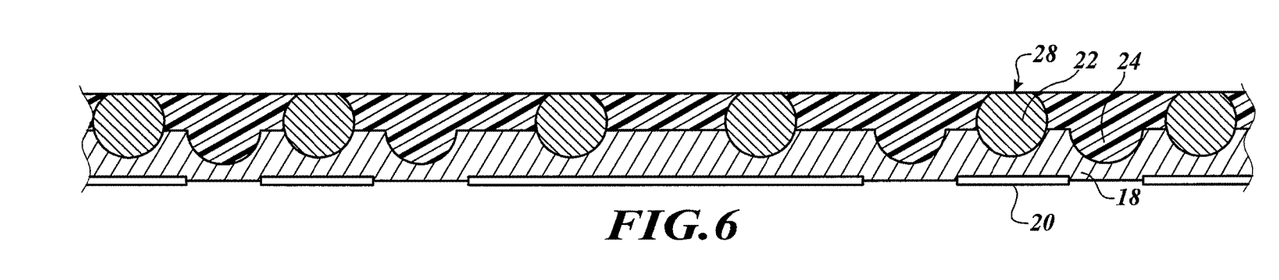

FIG. 6 shows the upper layer of the first molding compound 24 having been removed to expose the solder balls 22. The leadframe 18 as shown in FIG. 5 is subjected to a grinding process in which the upper layer of the molding compound 24 is removed. The grinding continues until the solder balls 22 are exposed and, then, continues for an additional depth in order to expose an area 28 of the solder balls 22. Namely, the grinding of the molding compound 24 continues until a significant surface area 28 of each solder ball 22 is exposed. In the embodiment shown in FIG. 6, this continues until approximately the top one-quarter of each solder ball 22 has been removed. In some embodiments, the grinding will continue until approximately half of the solder ball 22 has been removed so that the maximum possible surface area 28 is exposed of the full diameter of the solder ball 22. The extended removal of additional molding compound 24 is particularly beneficial where a low profile, ultrathin package of the type shown in FIG. 2 is desired. It also provides the benefit that additional surface area is provided in the solder ball 22 to enhance the electrical connection and reduce the resistivity between the semiconductor die 12 to be attached. The amount of molding compound 24 that is removed is, therefore, selected according to the desired package design profile and resistance correction.

The removal of the molding compound 24 and the top portion of each solder ball 22 can be achieved by any acceptable technique, milling being a preferred technique. It can also be removed using sawing, polishing, etching (either wet etching or dry etching), grinding, or other acceptable technique in order to remove the upper portion of molding compound 24 along with a portion of each solder ball 22.

Figure 7:
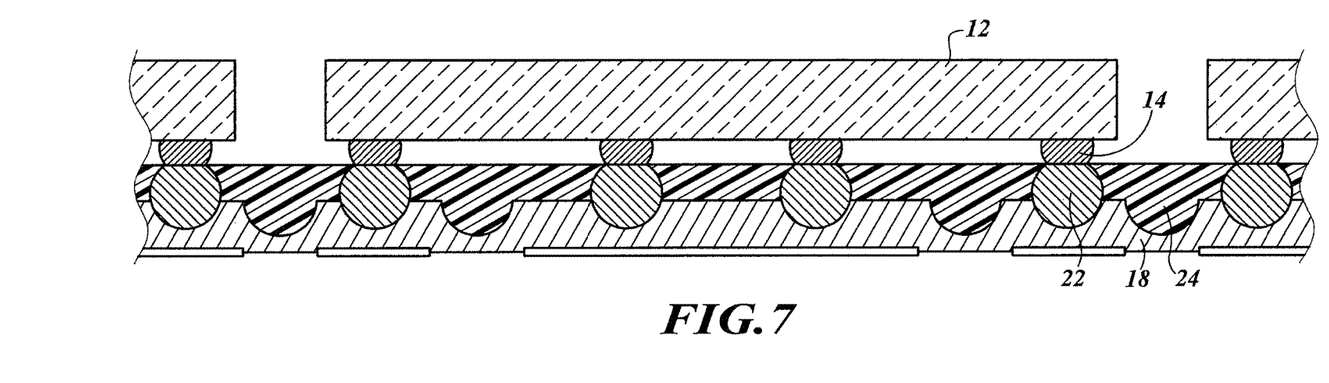
Figure 8:
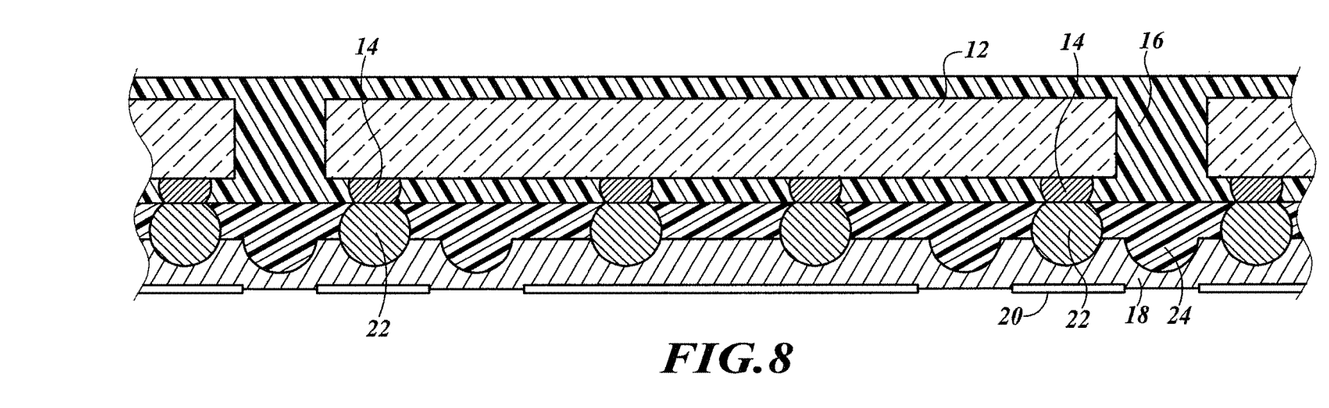

FIG. 7 shows a semiconductor die 12 having solder bumps 14. This assembly is coupled to the solder balls 22 of the leadframe 18. The semiconductor die is manufactured in a different process, using techniques well known in the art. The semiconductor die 12 includes a plurality of die pads, leads, or other electrical connections on a face thereof, as is known in the art. Solder bumps 14, or other electrical connections, are connected to the pads of the semiconductor die 12 in order to provide connections to other circuits. The techniques for connecting a solder bump 14 to a semiconductor die 12 are well known in the art and, therefore, not discussed in greater detail herein. As can be appreciated, any electrical connector can be used for the solder bump 14. For example, pillars, extended contact pads, aluminum layers, or other structures known for providing an extended electrical connection of the type provided by solder bumps 14 to the semiconductor die 12 can be used. The semiconductor die 12 and solder bump 14 assembly is prepared in a previous stage, and then is joined to the assembly as shown in FIG. 6 in order to achieve the assembly as shown in FIG. 7. This is performed by a pick and place machine or other acceptable mechanical device which places the semiconductor die 12 at the correct locations having the solder bumps 14 in direct contact with the matching solder balls 22 of the leadframe 18. The solder bumps 14 and/or 18 may be slightly heated to aid in the attachment to each other. Other attachment techniques may also be used.

The combined semiconductor die 12 and once molded leadframe 18 are placed in a second mold. After being placed in the second mold, a second molding compound 16 is injected into the second mold to fully encase the semiconductor die 12 and also to bond with the first molding compound 24. The second molding compound 16 is selected which will strongly adhere to and firmly mold to the first molding compound 24. In some embodiments, the second molding compound 16 may become a unitary, contiguous molding compound with the first molding compound 24 at their junction such that the line between them is virtually invisible and indistinguishable. The twice-molded assembly is provided by taking the first-molded leadframe 18 having the first molding compound 24 thereon and placing it into a second mold and then subjecting it to a second molding step, with the semiconductor die 12 attached in order to encapsulate a second time the leadframe 18 and for a first time the semiconductor die 12.

After the second molding step as shown in FIG. 8 is carried out, the assembly is removed from the second mold and a post-mold cure is carried out to fully cure the molding compound 16. At the time that the combined package is removed from the second mold, the solder bumps 14, 22 are independent and distinct from each other. In particular, the solder bump 14 that was separately formed on the semiconductor die 12 and the solder ball 22 that was previously formed and encapsulated in molding compound 24 as coupled to the frame 18 are not yet fully merged. The two solder balls were brought into contact with each other before the second molding compound 16 was injected into the second mold and cured to fully surround the exposed portions of both solder bumps 14, 22. The solder bumps 14 and 22 are in physical and electrical contact.

Figure 9:
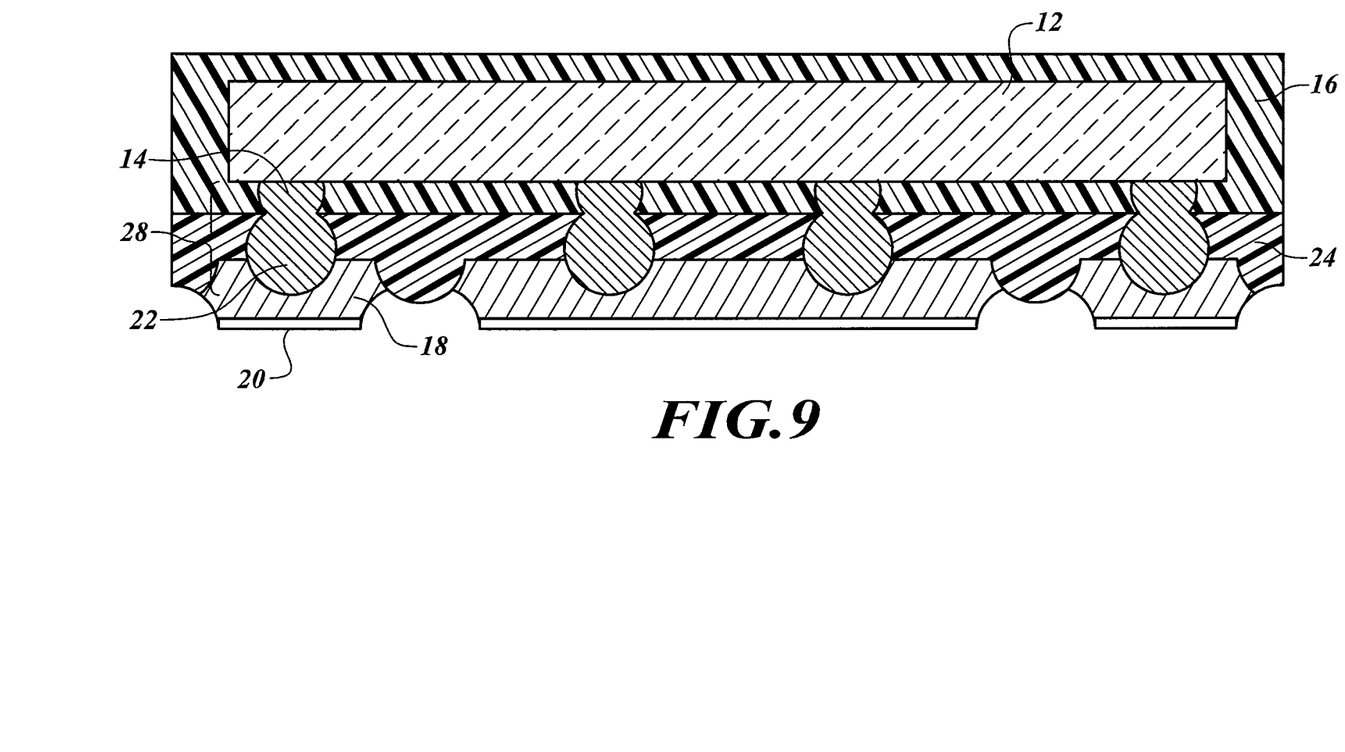
FIG. 9 is a cross-sectional view of an end package after the final step of FIG. 8.

FIG. 9 shows the individual twice-molded package 10 after a subsequent solder reflow step of solder bumps 14, 22 causes them to merge into a single, integral solder ball 28. This is performed by reheating the leadframe array having a plurality of leadframes and semiconductor die 12 connected in a large array to a reheating step that brings the solder bumps 14, 22 to their reflow temperature at which time the solder balls merge together into a single, contiguous solder ball 28. The solder ball reflow step is preferably carried out after the assembly has been removed from the second mold and has been twice-molded. The reflow temperature for the solder bumps 14, 22 will be selected to be compatible with each other and the type of solders will be selected to merge into a single, contiguous solder ball having a final metallic alloy of a desired type.

In one alternative embodiment, the reflow step is carried out when the assembly is in the condition as shown in FIG. 7, before the second molding compound 16 is injected. In particular, in the alternative embodiment, after the semiconductor die 12 is attached to the array of leadframes 18, a reflow step is carried out to fully and completely merge solder bumps 14, 22. After the full, high temperature reflow step is carried out, then the combined semiconductor die 12 and leadframe 18 are placed in the second mold and the second molding compound 16 is injected to achieve the final package as shown in FIG. 9.

In one preferred embodiment, the reflow occurs in two separate steps. In a first step, a first, minimal reflow is carried out when solder bump 14 is first brought into contact with solder ball 22 in order to adhere the two solder balls to each other and provide a strong mechanical and electrical connection. A first, minimum temperature reflow occurs by slight heating of the leadframe 18 with the solder ball 22 attached so that upon the solder bumps 14 touching the heated solder balls 22 there is a slight merge between the solder balls bringing them into strong mechanical and electrical connection. Preferably, this initial connection is carried out just as the semiconductor die 12 is first placed on the leadframe array 18 as shown in FIG. 7 in order to provide strong mechanical coupling.

The heating is performed by heating the leadframe 18 and solder balls 22, which, being made of metal, will easily transfer heat. Subsequently, the assembly is placed in the second mold and the second molding compound 16 injected. After the second molding compound has been injected, then a second, more complete and higher temperature reflow is carried out. The higher temperature reflow will be at a significantly high temperature so that the solders completely merge with each other as a single contiguous piece of metal. The second reflow will be a relatively high temperature compared to the first one, and often sufficiently high that the two solder materials 14, 22 become substantially liquid.

If the high temperature reflow were carried out when the assembly is partially completed as shown in FIG. 7, the solder bumps 14, 22 might run and change shape significantly, spreading out well beyond the desired location. They may, in some instance, fail to perform the proper electrical connections or short to other adjacent solder balls. However, once the solder balls have been fully encased as shown in FIG. 8, the movement of the solder bumps 14, 22 is strictly limited.

In the stages shown in FIG. 8, the solder balls can be subjected to a significantly high reflow temperature, nearly to their full liquid state temperature, so that a full mixing and reflow is carried out to completely combined the two solder balls to each other into a unitary solder ball 28 as shown in FIG. 9. The two molding compounds 16 and 24 form an enclosed cavity that keeps the solder in place; even when heated.

After the second reflow is carried out, the leadframe 18 is etched on the back side with an etching fluid that is selective to remove the leadframe material 18, but not remove the metal layer 20. Preferably, the leadframe 18 is made of copper, or in one embodiment aluminum. A wet etch which selectively removes copper, but does not remove nickel or a nickel, palladium, gold layer combination is used. This wet etch will remove the exposed copper portions of leadframe 18 so that some of the molding compound 24 protrudes through the bottom of the package, as can be seen in FIG. 9. After the back side etching of the copper is carried out, the package is singulated from the array to produce the final completed package 10, as shown in FIG. 9.

Figure 10:
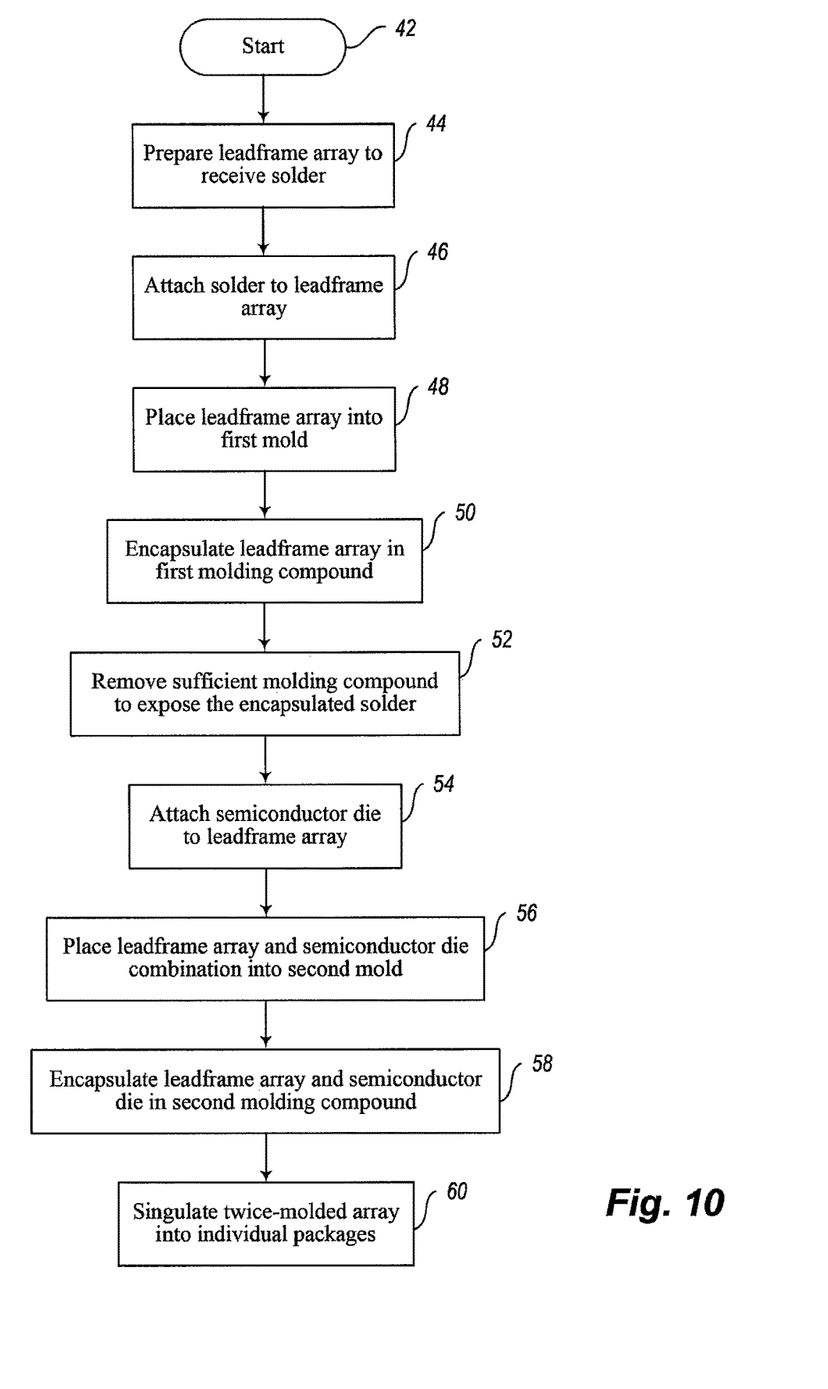
FIG. 10 is a flow chart of the sequence of making a twice-molded package.

FIG. 10 shows a flow chart for preparing the twice-molded semiconductor package according to the embodiments as described herein. The process starts at step 42 in which a leadframe is prepared and, in a completely separate process and a separate timing, a semiconductor die 12 is also prepared. In step 44, the leadframe array 18 is prepared to receive the solder. In this case, recesses are formed in the leadframe 18 to receive solder.

In step 46, solder 22 is attached to the leadframe array 18, usually as solder balls, but could be in another form as well. In step 48, the leadframe array 18 is placed into a first mold. Molding compound is injected to completely surround the solder balls 22, so they are fully encased and also to cover the top surface of the leadframe array 18. Subsequently, in step 52, the top of the completed molded leadframe is removed so as to expose portions of the encapsulated solder ball. After the top layer is removed, the semiconductor die 12 is electrically connected at the appropriate locations to the respective solder balls of the leadframe array 18, as seen in step 54. At this step, a slight heating of the leadframe array 18 can take place in order to increase the adhesion or, alternatively, some adhesive material may be used that will conductively couple the die 12 to the leadframe array 18. After the appropriate number of semiconductor die are connected to the respective proper locations in the leadframe array 18, the combination is placed into a second mold in step 56. Subsequently, in step 58, the combination is encapsulated to affix the package which includes the leadframe array 18 and the semiconductor die 12 in a second molding compound. After this, the twice-molded packages are singulated into individual packages in step 60.

Multiple embodiments have been shown for creating a twice-molded semiconductor package 10. The various embodiments may be combined with each other to achieve a wide variety of different packages according to the various alternative embodiments as taught herein.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for making a semiconductor die package, comprising:
   forming recesses in a first surface of a leadframe array;
   placing solder in the recesses of the leadframe array to form solder balls;
   placing the combined leadframe array and solder balls into a mold;
   injecting a molding compound into the mold sufficient to fully encapsulate the solder and the first surface of the leadframe array to create a once-molded leadframe array;
   removing an upper portion of the molding compound and the solder balls sufficient to expose an interior surface area of the solder;
   attaching a semiconductor die to the exposed solder;
   placing the combined semiconductor die and once-molded molded leadframe array into a second mold;
   injecting a second molding compound into the second mold to encapsulate the semiconductor die and the upper surface of the exposed first molding compound; and
   singulating individual semiconductor die packages from the twice-molded semiconductor package array.

2. The method of claim 1, further including:
   attaching a solder ball to the semiconductor die prior to connecting the die to the once-molded leadframe array.

3. The method according to claim 2 wherein the connection of the semiconductor die to the once-molded leadframe array includes the step comprising:
   bringing the solder connected to the semiconductor die into physical contact with the solder of the once-molded leadframe array.

4. The method according to claim 1 wherein the second molding compound fully encapsulates the semiconductor die and the exposed portions of the once-molded leadframe array.

5. The method according to claim 1 wherein the second molding compound fully encapsulates the electrical connection between semiconductor die and the once-molded leadframe array without encapsulating one full surface of the semiconductor die.

6. The method according to claim 1 wherein the second molding compound fully encapsulates the electrical connection between the semiconductor die and the once-molded leadframe array, but does not encapsulate side walls or an exposed surface of the semiconductor die.

7. A method for making a semiconductor die package, comprising:
forming recesses in a first surface of a leadframe array;
placing solder in the recesses of the leadframe array to form solder balls;
placing the combined leadframe array and solder balls into a mold;
injecting a molding compound into the mold sufficient to fully encapsulate the solder and the first surface of the leadframe array to create a once-molded leadframe array;
removing an upper portion of the molding compound and the solder balls sufficient to expose an interior surface area of the solder;
attaching a solder ball to a semiconductor die;
attaching the semiconductor die to the exposed solder after connecting the die to the once-molded leadframe array by bringing the solder connected to the semiconductor die into physical contact with the solder of the once-molded leadframe array;
placing the combined semiconductor die and molded leadframe array into a second mold;
injecting a second molding compound into the second mold to encapsulate the semiconductor die and the upper surface of the exposed first molding compound to create a twice-molded semiconductor die package array;
heating the twice-molded semiconductor die array to a sufficient temperature to reflow the solder to merge the solder ball coupled to the die to the solder ball of the once-molded leadframe array to obtain an integral solder coupling between the semiconductor die and the leadframe; and
singulating individual semiconductor die packages from the twice-molded semiconductor die package array.

8. The method according to claim 7 wherein the heating step is carried out prior to the semiconductor die being placed in the second mold and second molding compound injected therein.

9. The method according to claim 7 wherein the heating step is carried out after the semiconductor die has been removed from second the mold and second molding compound encapsulating it has been cured.

10. The method according to claim 8, further comprising:
subjecting the solder coupled to the semiconductor die to a first temperature in the heating step to mechanically and electrically affix the solder of the die to the solder of the once-molded leadframe array; and
subsequently carrying out the step of placing the semiconductor die and leadframe in the second mold and injecting the second molding compound, after which a second reflow temperature is carried out by subjecting the twice-molded semiconductor package array to a second temperature higher than the first temperature to carry out a second reflow to more completely combine the solder ball of the semiconductor die with the solder ball of the leadframe array.

11. The method according to claim 7 wherein the heating step is carried out concurrently with the step of injecting a second molding compound into the second mold to encapsulate the semiconductor die and the upper surface of the exposed first molding compound to create a twice-molded semiconductor die package array.

12. A semiconductor package comprising:
a leadframe having a first side and a second side, the lead frame including a lead;
a first solder member connected to the first side of the lead;
a first molding compound extending from the first side of the lead, the first molding compound encapsulating the first solder member and the first side of the lead;
a semiconductor die having an electrical pad on a first surface thereon;
a second solder member connected to the electrical pad of the semiconductor die and to the first solder member that provides an electrical connection from the semiconductor die to the lead of the leadframe; and
a second molding compound that encapsulates the semiconductor die, the second solder member and is in direct physical contact with both the second solder member and the first molding compound.

13. The semiconductor package of claim 12 wherein the first solder member is a solder ball.

14. The semiconductor package of claim 12 wherein the first molding compound and the second molding compound are comprised of different materials.

15. The semiconductor package of claim 12 wherein the second molding compound encapsulates the sidewalls and the first surface of the semiconductor die but not a second surface of the semiconductor die that is opposite the first surface.

16. The semiconductor package of claim 12 wherein the second molding compound encapsulates the first surface of the semiconductor die but not the sidewall or a second surface of the semiconductor die that is opposite the first surface.

17. A The semiconductor package comprising
a leadframe having a first side and a second side, the leadframe including a lead;
a first solder member connected to the first side of the lead;
a first molding compound extending from the first side of the lead, the first molding compound encapsulating the first solder member and the first side of the lead;
a semiconductor die having an electrical pad on a first surface thereon;
a second solder member connected to the electrical pad of the semiconductor die and to the first solder member that provides an electrical connection from the semiconductor die to the lead of the leadframe; and
a second molding compound that encapsulates the semiconductor die, the second solder member and is in direct physical contact with the first molding compound
wherein first solder member and the second solder member have been bonded to each other in a heat treatment to form a single, contiguous solder member.

18. A semiconductor package comprising:
a leadframe having a first side and a second side, the lead-frame including a plurality of leads;

a plurality of solder balls, one solder ball of the plurality being connected to the first side of each of the respective leads of the plurality of leads;

a first molding compound connected to the first side of the lead, the first molding compound encapsulating each of the solder balls and the first side of each lead;

a semiconductor die having a plurality of electrical pads thereon;

a plurality of solder members connected to each respective electrical pad of the semiconductor die and also to respective solder balls, the solder members and solder balls forming single, contiguous metal connection between the semiconductor die and the leadframe; and a second molding compound that encapsulates the semiconductor die, the second solder member and is in direct physical contact with both the solder members and the first molding compound.

19. The semiconductor package of claim 18 wherein the first molding compound and the second molding compound form a unitary, contiguous molding compound.

20. The semiconductor package of claim 18 wherein the solder balls and the solder members are comprised of the same metal alloy.

21. The semiconductor package of claim 18 wherein at least two of the solder balls are connected to the same lead to electrically connect the two solder balls and two of the electrical pads on the semiconductor to each other.

* * * * *

UNITED STATES PATENT AND TRADEMARK OFFICE
CERTIFICATE OF CORRECTION

PATENT NO. : 10,204,814 B1
APPLICATION NO. : 15/663624
DATED : February 12, 2019
INVENTOR(S) : Jefferson Talledo Page 1 of 1

It is certified that error appears in the above-identified patent and that said Letters Patent is hereby corrected as shown below:

In the Claims

Column 10, Line 44:
"A The semiconductor package comprising"
Should read:
--A semiconductor package comprising:--.

Column 10, Line 62:
"wherein first solder member and the second solder member"
Should read:
--wherein the first solder member and the second solder member--.

Signed and Sealed this
Eighteenth Day of June, 2019

Andrei Iancu
*Director of the United States Patent and Trademark Office*